(12) United States Patent
Yamada et al.

(10) Patent No.: US 7,746,648 B2
(45) Date of Patent: Jun. 29, 2010

(54) MODULAR HEAT-RADIATION STRUCTURE AND CONTROLLER INCLUDING THE STRUCTURE

(75) Inventors: Hiroshi Yamada, Tokyo (JP); Tomonori Abe, Tokyo (JP); Keiichi Takikoshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 536 days.

(21) Appl. No.: 10/591,134

(22) PCT Filed: Mar. 18, 2004

(86) PCT No.: PCT/JP2004/003811

§ 371 (c)(1),
(2), (4) Date: Aug. 30, 2006

(87) PCT Pub. No.: WO2005/091692

PCT Pub. Date: Sep. 29, 2005

(65) Prior Publication Data

US 2007/0139896 A1 Jun. 21, 2007

(51) Int. Cl.
*H05K 7/20* (2006.01)
*H01L 23/34* (2006.01)
*F28F 7/00* (2006.01)

(52) U.S. Cl. ........................ 361/715; 361/709; 361/719; 257/713; 257/722; 165/80.3; 165/185; 174/16.3

(58) Field of Classification Search ................. 361/709, 361/710, 715, 717–719, 723, 773; 257/713, 257/721, 722; 165/80.2–80.3, 185; 174/16.1, 174/16.3

See application file for complete search history.

(56) References Cited

U.S. PATENT DOCUMENTS

| 3,880,493 | A | * | 4/1975 | Lockhart, Jr. ................ 439/525 |
| 4,636,918 | A | * | 1/1987 | Jodoin ......................... 361/773 |
| 4,941,069 | A | * | 7/1990 | Danenberg et al. ........... 361/809 |
| 5,001,601 | A | * | 3/1991 | Fuoco .......................... 361/699 |
| 5,237,485 | A | * | 8/1993 | Cognetti de Martiis et al. .......................... 361/712 |
| 5,546,275 | A | * | 8/1996 | Moutrie et al. ............... 361/707 |
| 5,703,752 | A | * | 12/1997 | Woo ............................ 361/704 |
| 6,067,231 | A | * | 5/2000 | Lu ............................... 361/704 |
| 6,487,078 | B2 | * | 11/2002 | Kledzik et al. ............... 361/704 |
| 7,206,204 | B2 | * | 4/2007 | Nakatsu et al. .............. 361/703 |
| 7,360,586 | B2 | * | 4/2008 | Mania et al. ................. 165/185 |

FOREIGN PATENT DOCUMENTS

| JP | 43-29597 U | 12/1968 |
| JP | 50-47370 | 5/1975 |
| JP | 54-61561 U | 4/1979 |
| JP | 2002-111250 A | 4/2002 |
| JP | 2002-330523 A | 11/2002 |

\* cited by examiner

*Primary Examiner*—Zachary M Pape
(74) *Attorney, Agent, or Firm*—Sughrue Mion, PLLC

(57) ABSTRACT

A modular heat-radiation structure includes a module for generating heat, including a first main unit having a heat-radiation fin, fixed to the top face of the first main unit for radiating heat generated in the module and a resin-made and insulating heat shield inserted between the printed circuit board and the first main unit.

5 Claims, 9 Drawing Sheets (a)

(b)

(a)

(b)

(a)

(b)

MODULAR HEAT-RADIATION STRUCTURE AND CONTROLLER INCLUDING THE STRUCTURE

BACKGROUND ART

A conventional modular heat-radiation structure is explained referring to Japanese Laid-Open Patent Publication 111,250/2002. According to this Patent Publication, a controller includes a printed circuit board, a module mounted on the printed circuit board, a screw for fixing the module with a heat-radiation fin for radiating heat that the module generates, and a plate-like fixture provided with a hook. The fixture is inserted between the printed circuit board and the module, and is fixed to the printed circuit board by the hook; moreover, the fixture fixes the printed circuit board with the module.

According to such modular heat-radiation structure, when the module is mounted so as to float over the printed circuit board due to a reason such as improvement of its mounting efficiency, by mounting onto the printed circuit board the plate-like fixation disc sandwiched between the module and the printed circuit board, an integral unit of the heat-radiation plate fixed by the screw and the module can be supported not only by a solder-adhered portion as a modular wiring portion, but also by the whole of the plate-like fixation disc. Therefore, even if a further heavy heat-radiation plate, etc. is mounted, the weight can be distributed over the fixation disc, and the weight weighed upon the solder-adhered portion can be reduced; consequently, solder crack occurrence can be remarkably reduced. As a result, the device quality can be improved.

However, accompanying high-density mounting inside a controller, in the above modular attachment structure, due to heat generation from the bottom face of the module, a problem has occurred that, for example, deformation due to the thermal expansion of the printed circuit board is difficult to be prevented.

DISCLOSURE OF THE INVENTION

The present invention is made to resolve problems of the above described prior art. A prime objective of the present invention is to provide a modular heat-radiation structure for preventing deformation, etc. of a printed circuit board caused by thermal expansion due to heat generated from the bottom of a module, and also for radiating, to outer space using a heat-radiation fin caused by thermal conduction, heat generating from the top of the module, and to provide a controller including the structure.

A modular heat-radiation structure according to a first aspect of the present invention includes a printed circuit board, a module for generating heat, including a first main unit having a fixing hole and a lead for connecting to the printed circuit board, a heat-radiation fin, fixed to the top face of the first main unit, for radiating heat generated in the module, a resin-made and insulating heat shield inserted between the printed circuit board and the first main unit, and a fixing element for fixing the heat shield, the module, and the heat-radiation fin; wherein a lead hole for allowing the lead to pass therethrough and a first fixing hole for allowing the fixing element to pass therethrough are provided in the heat shield, and a second fixing hole for allowing the fixing element to pass therethrough is provided in the printed circuit board.

A controller including the modular heat-radiation structure according to a second aspect of the present invention includes a chip fixed onto the printed circuit board and mounted under the first main unit, wherein either a slit or a concave for inserting the chip is formed in the heat shield.

A controller including the modular heat-radiation structure according to a third aspect of the present invention includes an electric power source as a source for driving the module, and a case, having a mouth for opening the top face of the module, for mounting the printed circuit board, the module, the electric power source, and the heat shield, wherein the case includes a separator for separating from the electric power source the heat-radiation fin and the module.

In a controller including the modular heat-radiation structure according to a forth aspect of the present invention, the separator includes a first separator attached to the case so as to be arranged along a side face of the heat-radiation fin, and a second separator, being approximately U-shaped, attached to the heat shield so as to be arranged contacting or closed to the first separator.

In a controller including the modular heat-radiation structure according to a fifth aspect of the present invention, the case is made of resin, the mouth of the case is formed slightly larger than the first main unit, and a head is provided closed to and facing the bottom face of the heat-radiation fin around the mouth of the case.

A controller including the modular heat-radiation structure according to a sixth aspect of the present invention includes a stack for generating heat, including a second main unit, whose lead is fixed to the printed circuit board, being rectangularly and vertically arranged, a heat-radiation fin including a mouth for protruding the second main unit of the stack, and also including a fold, and a clip for contacting the fold to the second main unit, having elasticity towards its open/close movement.

In a controller including the modular heat-radiation structure according to a sixth aspect of the present invention, the heat shield is provided with a mouth for allowing the second main unit of the stack to pass therethrough, and also with a protrusion for supporting the second main unit along the longitudinal orientation of the mouth.

According to the first aspect of the present invention, radiation heat generated from the bottom face of the modular main unit is shielded by the heat shield, and heat generated from the top face of the modular main unit is also conducted to the heat-radiation fin and radiated to outer space thereby. Therefore, it is effective to prevent deformation, etc. of the printed circuit board caused by thermal expansion due to heat generated from the bottom of a module.

According to the second aspect of the present invention, because either the slit or the concave for inserting the chip is provided as the heat shield, the chip can be installed inside the heat shield. Therefore, it is effective to prevent heat radiated from the modular bottom face, and also to save space.

According to the third aspect of the present invention, because the separator for separating from the electric power source the heat-radiation fin and the module is provided in the case, radiation heat generated from the heat-radiation fin and the module is shielded by the separator. Therefore, it is effective that the radiation heat generated from the heat-radiation fin and the module is difficult to transmit to the electric power source.

According to the forth aspect of the present invention, not only the separator can be easily formed, but also because the second separator is approximately U-shaped, radiation heat generated from the module can be shielded by the second separator. Therefore, it is effective that the radiation heat is difficult to transmit to the electric power source.

According to the fifth aspect of the present invention, because heat generated from the heat-radiation fin can be shielded by the top of the case, heat radiation from the heat-radiation fin to the module is reduced. Therefore, it is effective to accelerate the heat radiation from the module.

According to the sixth aspect of the present invention, it is effective that not only the heat-radiation fin can be commonly used for the module and the stack, but also the stack can easily be thermally connected to the heat-radiation fin.

According to the seventh aspect of the present invention, because the mouth for allowing the second main unit of the stack to pass therethrough, and the protrusion for supporting the second main unit along the longitudinal orientation of the mouth, it is effective to support the stack by the protrusion.

BEST MODE FOR CARRYING OUT THE INVENTION

Embodiment 1

Figure 1:
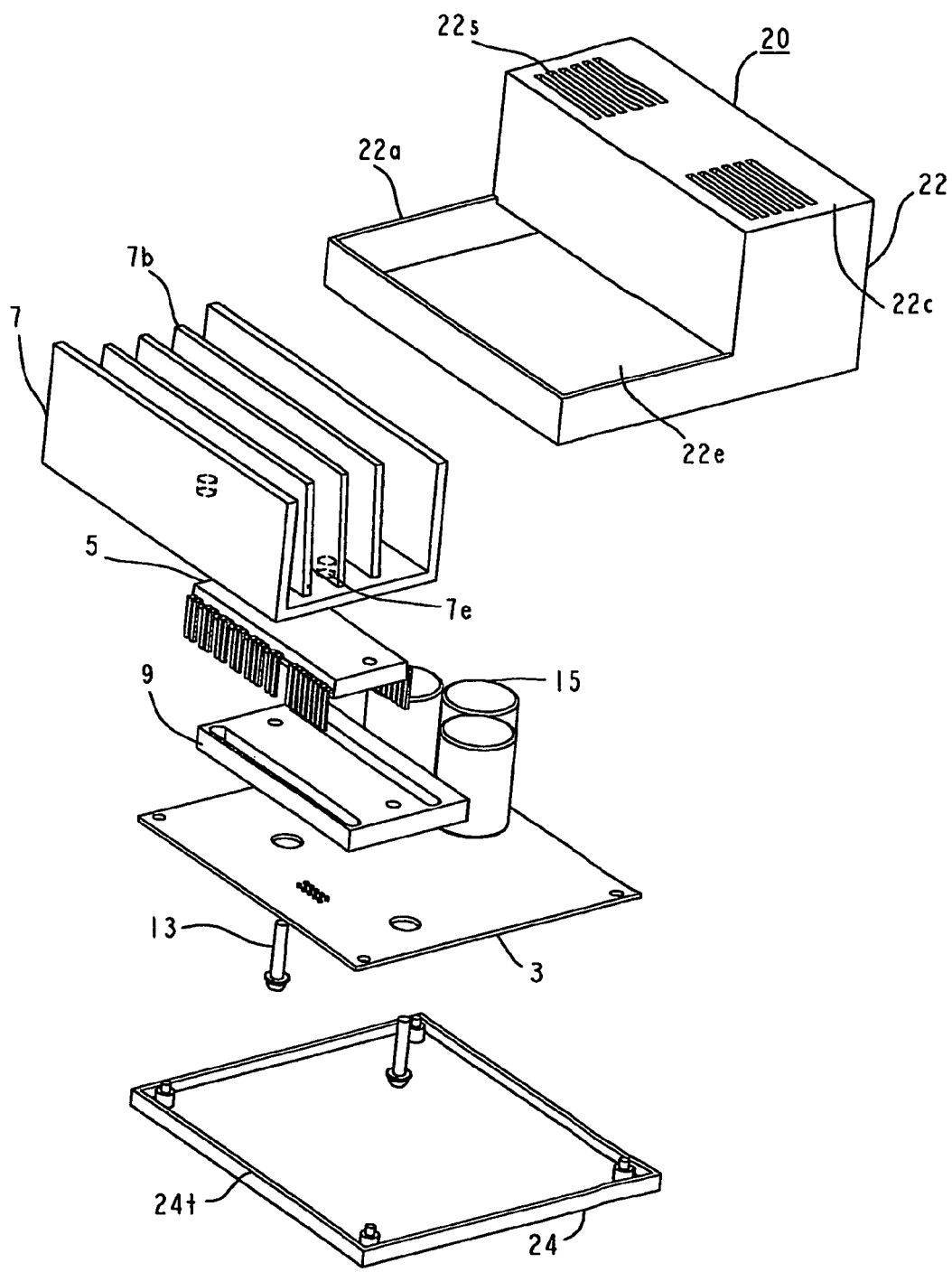
FIG. 1 is an exploded perspective view illustrating a controller including a modular heat-radiation structure according to an embodiment of the present invention.
Figure 2:
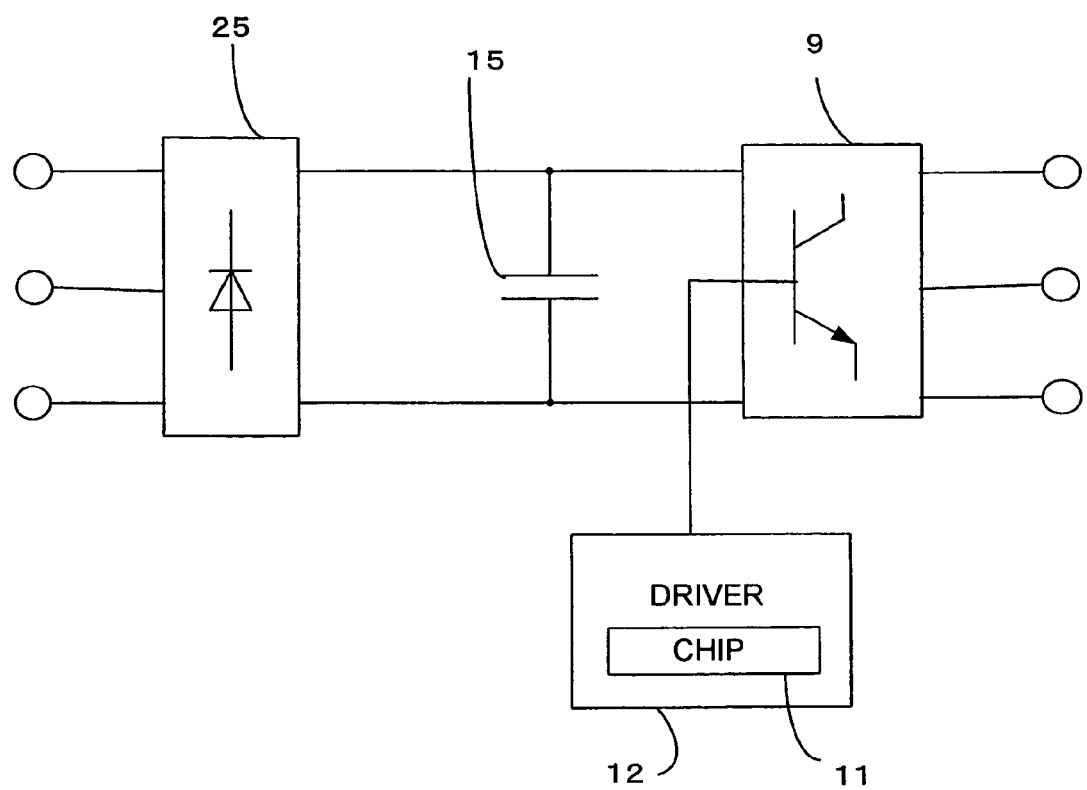
FIG. 2 is an internal circuit diagram illustrating the controller represented in FIG. 1.
Figure 3:
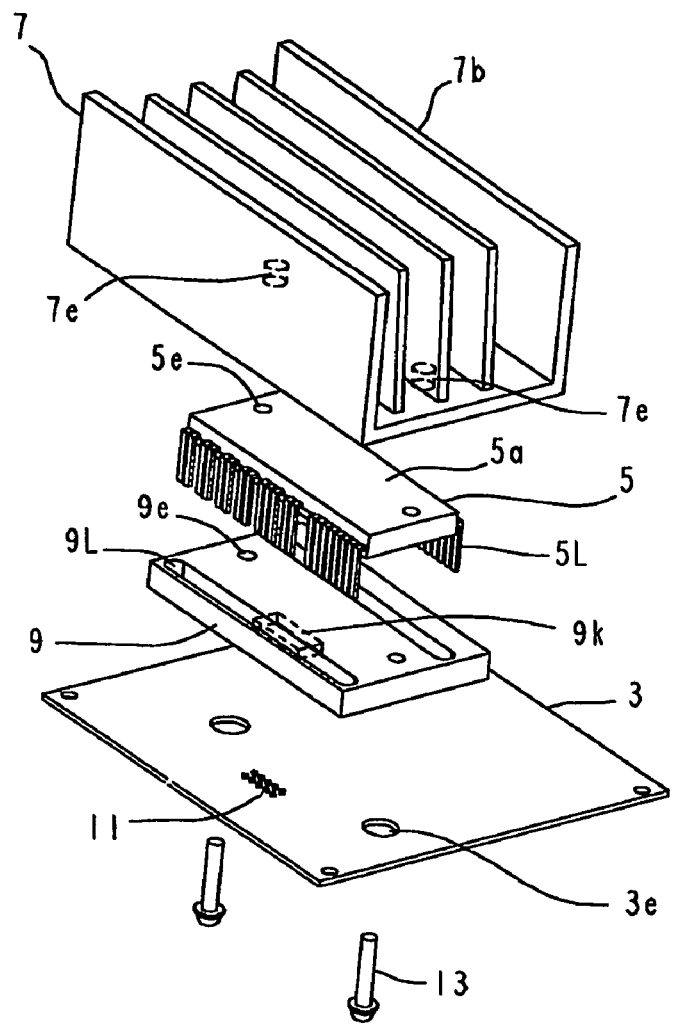
FIG. 3 is an exploded perspective view (a) of the modular heat-radiation structure, and a bottom view (b) of the heat shield, represented in FIG. 1.
Figure 3:
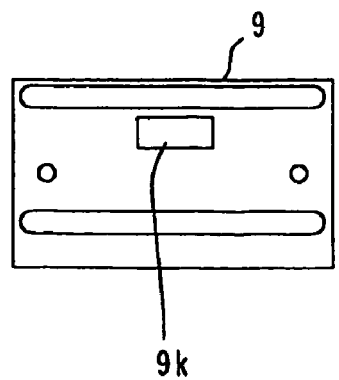

An embodiment according to the present invention is explained using FIG. 1-FIG. 3. FIG. 1 is an exploded perspective view illustrating a controller using a modular heat-radiation structure according to the embodiment of the present invention; FIG. 2 is an internal circuit diagram illustrating the controller represented in FIG. 1; and FIG. 3 is an exploded perspective view illustrating the modular heat-radiation structure represented in FIG. 1. In FIG. 1, a controller 1 using the modular heat-radiation structure includes a printed circuit board 3, chips 11 and electrolytic capacitors 15 mounted on the printed circuit board 3, a power module 5, fixed to the printed circuit board 3 through a heat shield 9, in which a transistor generating heat is encapsulated, a heat-radiation fin 7 for radiating heat of the power module 5, and a case 20, composed of a bottom board 24 and a cover 22 formed stepwise to have two steps, for storing the heat shield 9.

Moreover, regarding the connection lines of the controller 1 as represented in FIG. 2, the electrolytic capacitor 15 is connected to the dc side of a diode stack 25 for converting an inputted ac voltage to a dc voltage, the power module 5 is connected as an inverter that can convert the dc voltage to an ac voltage having an arbitrary frequency, and a driver 12 having the chip 11 for driving the power module 5 is connected.

In FIG. 3, the modular heat-radiation structure includes the plane printed-circuit-board 3, the power module 5 having not only lead lines 5L as a lead connected to a first main unit 5a and the printed circuit board 3 by solder but also fixing holes 5e provided in the approximately plane first-main-unit 5a, and generating heat, the heat-radiation fin 7, fixed to the upper face (top face) of the first main unit 5a, not only having plane folds 7b for radiating the heat generated in the module 5 but also being provided with screw holes 7e, the plane heat shield 9, which is inserted between the printed circuit board 3 and the first main unit 5a, being resin-made and insulating, and screws 13 as a fixture for fixing the power module 5 with the heat-radiation fin 7.

In the heat shield 9, slit lead openings 9L for allowing the lead lines 5L to pass therethrough, first fixing holes 9e for allowing the screw 13 to pass therethrough, and a concave 9k for storing the chips 11 are provided. In order to prevent the heat generated from the bottom face of the power module 5, the heat shield 9 is formed in such a way that its thickness is thinner than a length obtained by subtracting the thickness of the printed circuit board 3 from the longitudinal length of the lead line 5L. Here, in order to store the chips 11, a through hole may also be provided other than the concave 9k; however, the reason why the concave 9k is applied is because the radiation of the heat generated from the bottom of the power module 5 to a plurality of the chips 11 and the printed circuit board 3 positioning on the bottom of the power module is intended to be prevented. In the printed circuit board 3, second fixing holes 3e for allowing the screws 13 to pass therethrough are provided.

Such configured modular heat-radiation structure can be obtained as follows. The heat shield 9 is mounted in such a way that the concave 9k positions on the chips 11 mounted on the printed circuit board 3, the lead lines 5L of the power module 5 are passed through the lead openings 9L of the heat shield 9, the lead lines 5L are also passed through through-holes, which are not illustrated in the figure, of the printed circuit board 3, and then soldering is performed. Then, after the bottom face of the heat-radiation fin 7 is laid onto the top face of the power module 5, the screws 13 are screwed, through the second fixing holes 3e of the printed circuit board 3, the first fixing holes 9e of the heat shield 9, and the fixing holes 5e of the power module 5, into the screw holes 7e of the heat-radiation fin 7.

Then, when the controller 1 is driven, the power module 5 operates and generates heat. The heat generated is conducted to the heat-radiation fin 7 from the top face of the main unit 5a of the power module 5, and then radiated from the surface of the heat-radiation fin 7. On the other hand, the radiation heat generated from the bottom of the main unit 5a of the power module 5 is shielded by the heat shield 9. Therefore, almost of the heat generated from the main unit 5a of the power module 5 is conducted to the heat-radiation fin 7, and radiated thereby to the outdoor air; moreover, a heat amount radiated to the chips 11 and the printed circuit board 3 is reduced by the heat shield 9. Consequently, thermal deformation of the printed circuit board 3 is to be relaxed.

Embodiment 2

Figure 4:
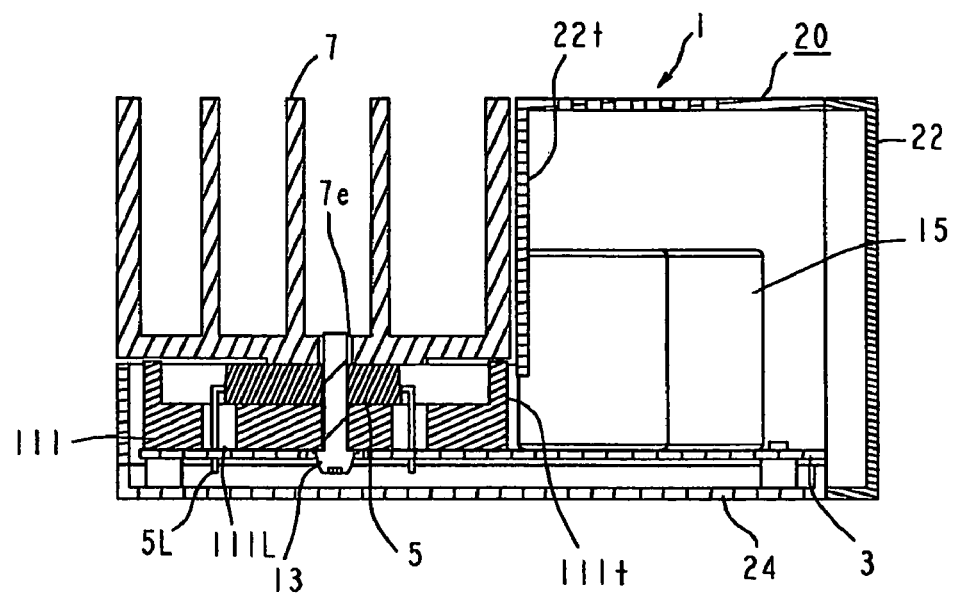
FIG. 4 is a transverse sectional view (a) of the controller represented in FIG. 1, and a perspective view (b) of a unit composed of a heat shield, a printed circuit board, and electrolytic capacitors.
Figure 4:
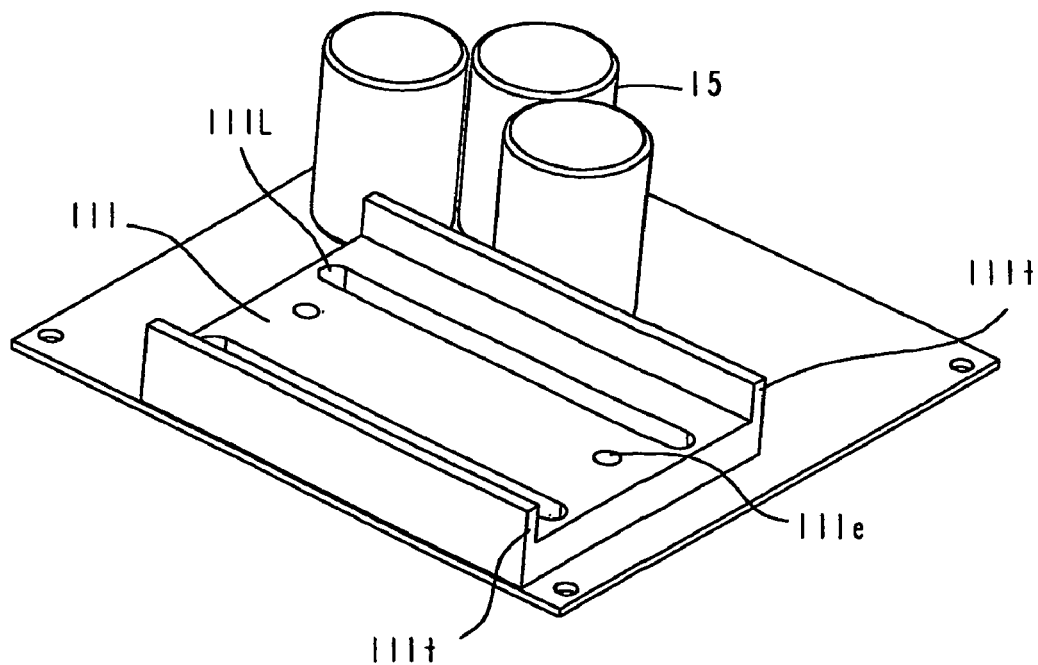
Figure 5:
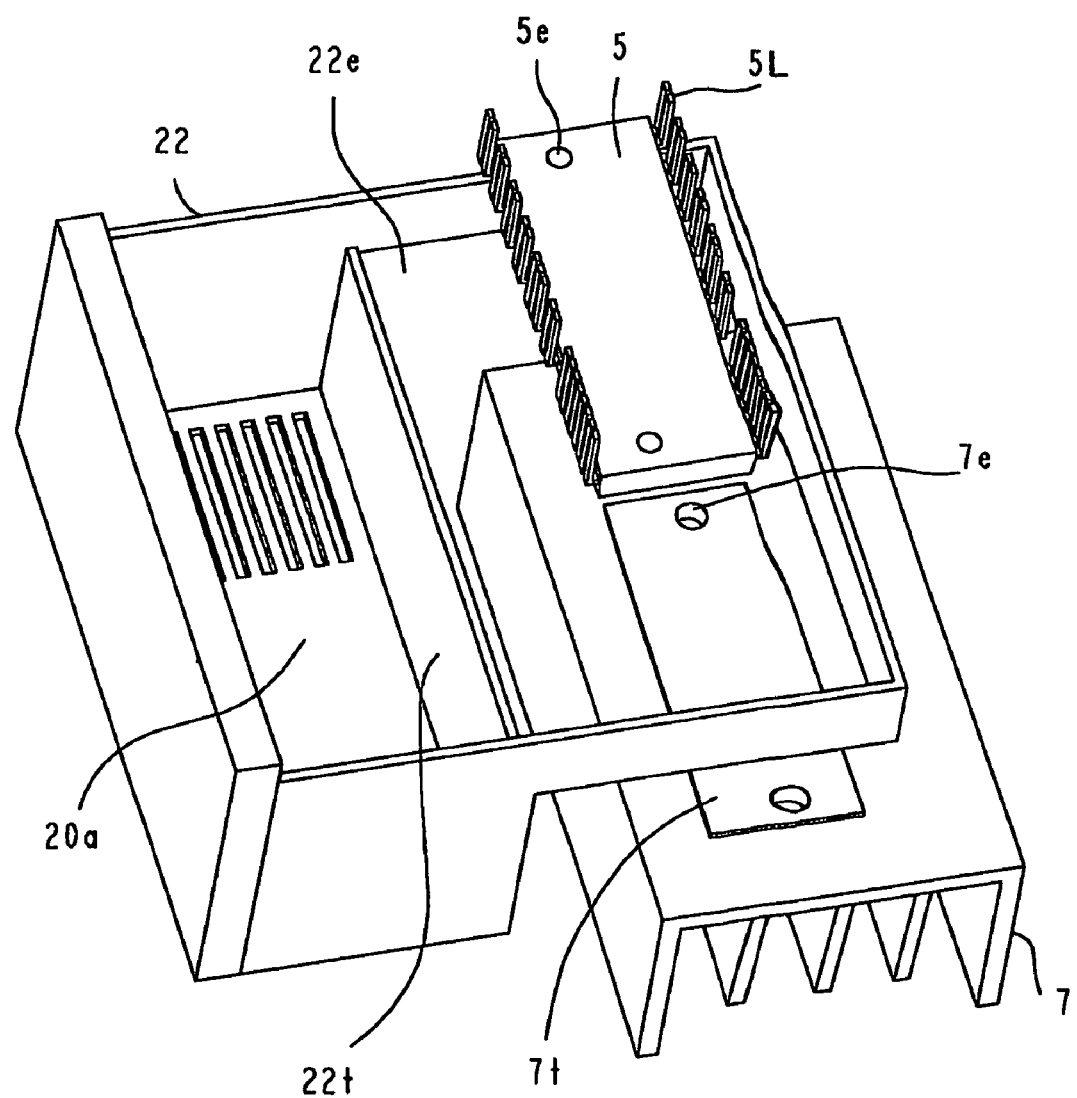
FIG. 5 is an exploded perspective view, viewed from the bottom face, of the controller represented in FIG. 4.

Another embodiment according to the present invention is explained using FIG. 1, FIG. 4, and FIG. 5. FIG. 4 is a transverse sectional view (a) of the controller represented in FIG. 1, and a perspective view (b) of a unit composed of a heat shield, a printed circuit board, and electrolytic capacitors; and FIG. 5 is an exploded perspective view, viewed from the bottom face, of the controller represented in FIG. 4. The same symbols in FIG. 4 and FIG. 5 as those in FIG. 1-FIG. 3 are assigned to the same or equivalent elements, and the explanation is omitted.

In FIG. 1, FIG. 4, and FIG. 5, the controller is characterized to be separated into a non heat-generation portion in which the electrolytic capacitors 15, etc. whose heat generation is relatively insignificant are installed inside the case 20, and a heat-generation portion in which the heat generation such as the power module 5 is larger than that of the electrolytic capacitors 15. Moreover, the heat-generation portion and the non heat-generation portion are separated by a division formed by a side wall 22t of the cover 22, to be the vertical portion between the first level to the second level of the case 20, and by protrusions 111t of a heat shield 111. Here, the division may be formed by either the side wall 22t of the cover 22 or the protrusions 111t.

Here, the heat-radiation fin 7 has a convex face 7f contacting the bottom of the power module 5.

The case 20 includes the plane bottom board 24 and the cover 22, and the bottom board 24 is provided with a vertically arranged piece 24 rectangularly and vertically arranged around the entire periphery of the bottom board. The stepwise structured cover 22 having the first level 22a and the second level 22c has a mouth 22e, for protrude the folds 7b of the heat-radiation fin 7, which is obtained by opening the upper face of the first level, and has a plurality of slits 22s in the upper face of the second level whose bottom is opened.

The heat shield 111 is provided with slit lead openings 111L for allowing the lead lines 5L of the power module 5 to pass therethrough, first fixing holes 111e for allowing the screws 13 to pass therethrough, and the protrusions 111t that are vertically arranged at the peripheries of the heat shield. Although two protrusions 111t are provided in this example, only the protrusion close to the side wall 22t of the cover may be provided. Thereby, the division described as above can be formed.

According to such controller, by dividing between the heat-generation portion and the non heat-generation portion using the division inside the case 20, the radiation heat generated in the power module 5 provided inside the heat-generation portion becomes difficult to conduct to the electrolytic capacitors 15 provided inside the non heat-generation portion.

Figure 6:
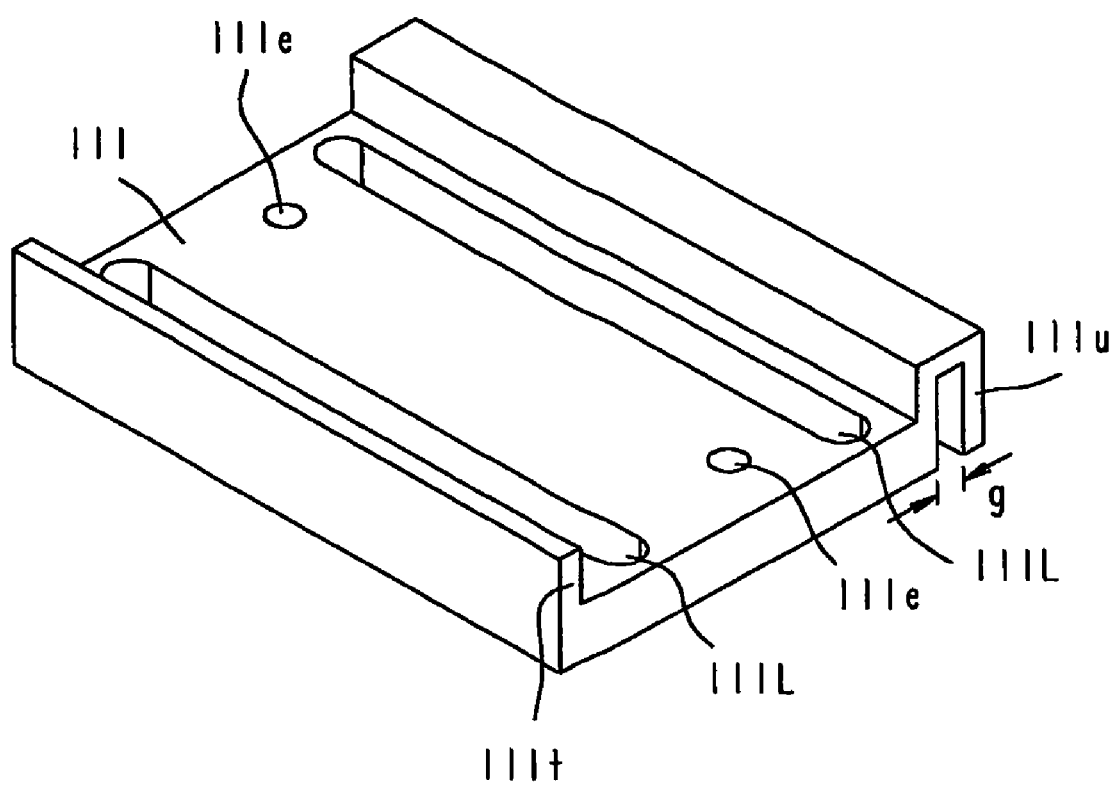
FIG. 6 is a perspective view illustrating a heat shield according to another embodiment of the present invention.

Moreover, as represented in FIG. 6, by providing a U-shaped portion 111u at an edge of the heat shield 111, the heat-generation portion and the non heat-generation portion are especially and thermally and separated each other. That is, by providing a gap g inside the U-shaped portion 111u of the heat shield 111, the heat-generation portion and the non heat-generation portion are further separated each other.

Figure 7:
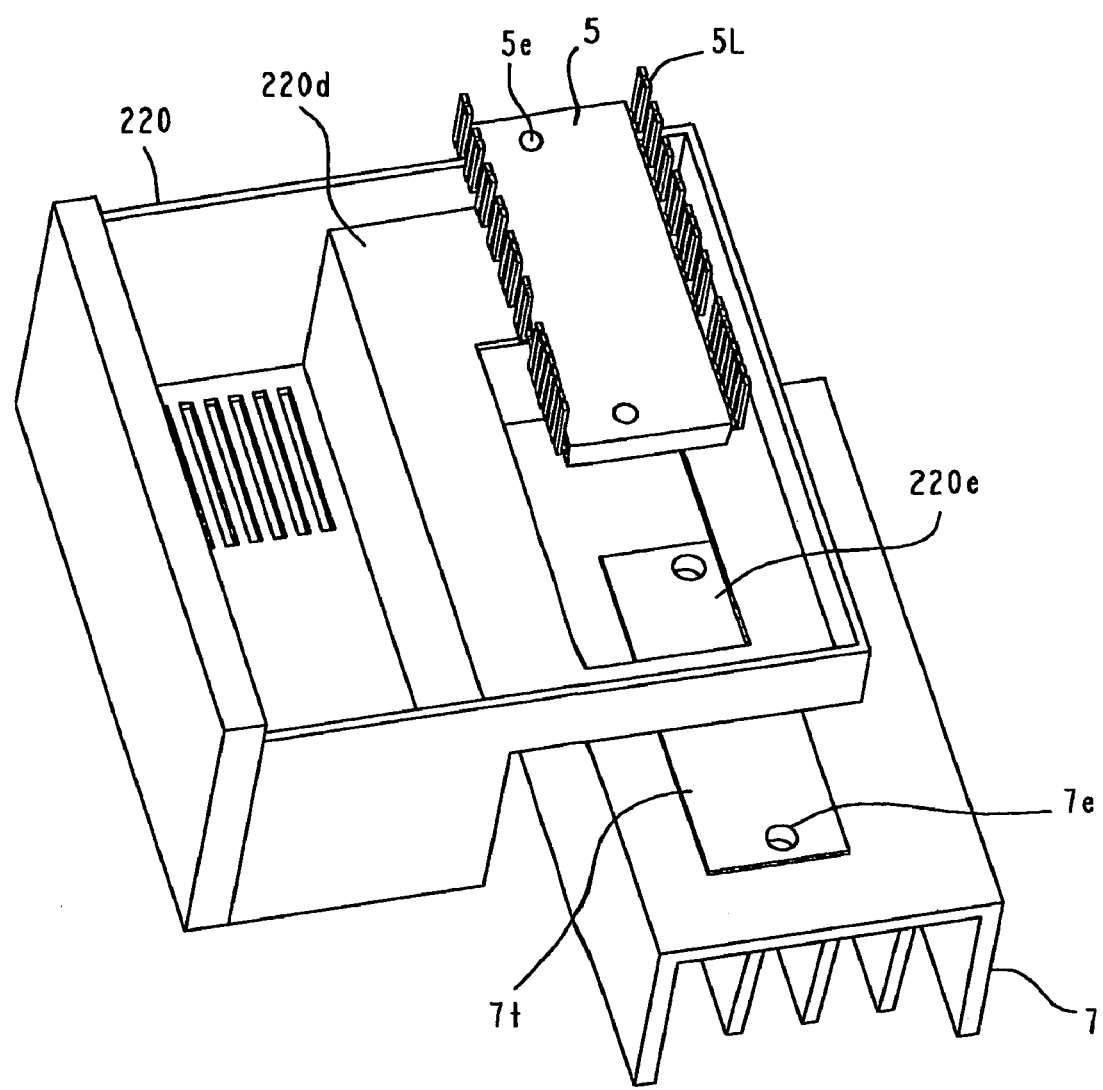
FIG. 7 is an exploded perspective view, viewed from the bottom face, of a controller according to another embodiment of the present invention.

Furthermore, a case 220 is made of resin as represented in FIG. 7, a mouth 220e of the case 220 is formed slightly larger than the first main unit 5a of the power module 5, and a top 220d facing close to the bottom of the heat-radiation fin 7 is provided around the mouth 220e.

According to the controller using such case 220, the heat-radiation fin 7 is heated by heat conducted from the power module 5; consequently, the radiation heat accompanying the heating of the fin becomes difficult to radiate the module 5, etc.

Embodiment 3

Figure 8:
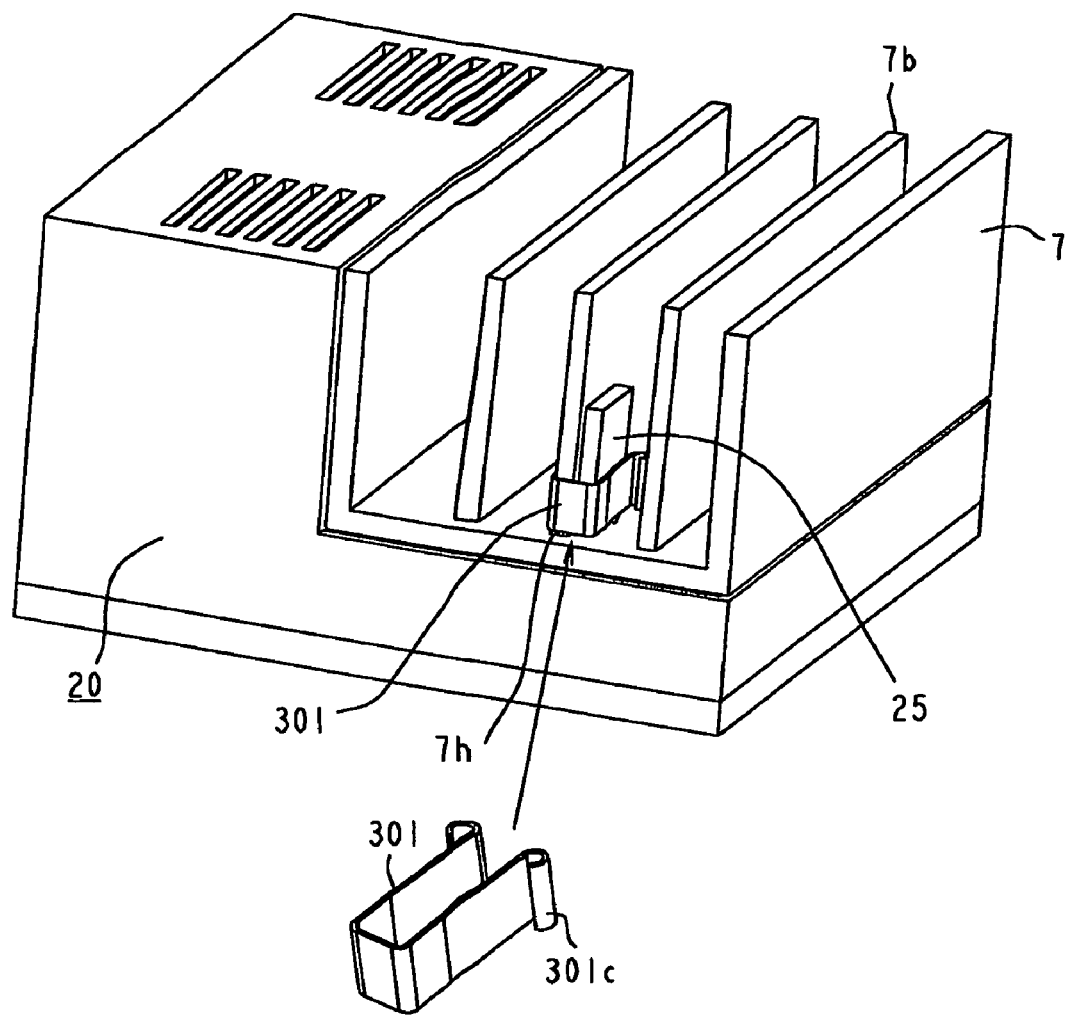
FIG. 8 is a perspective view illustrating a controller according to another embodiment of the present invention.
Figure 9:
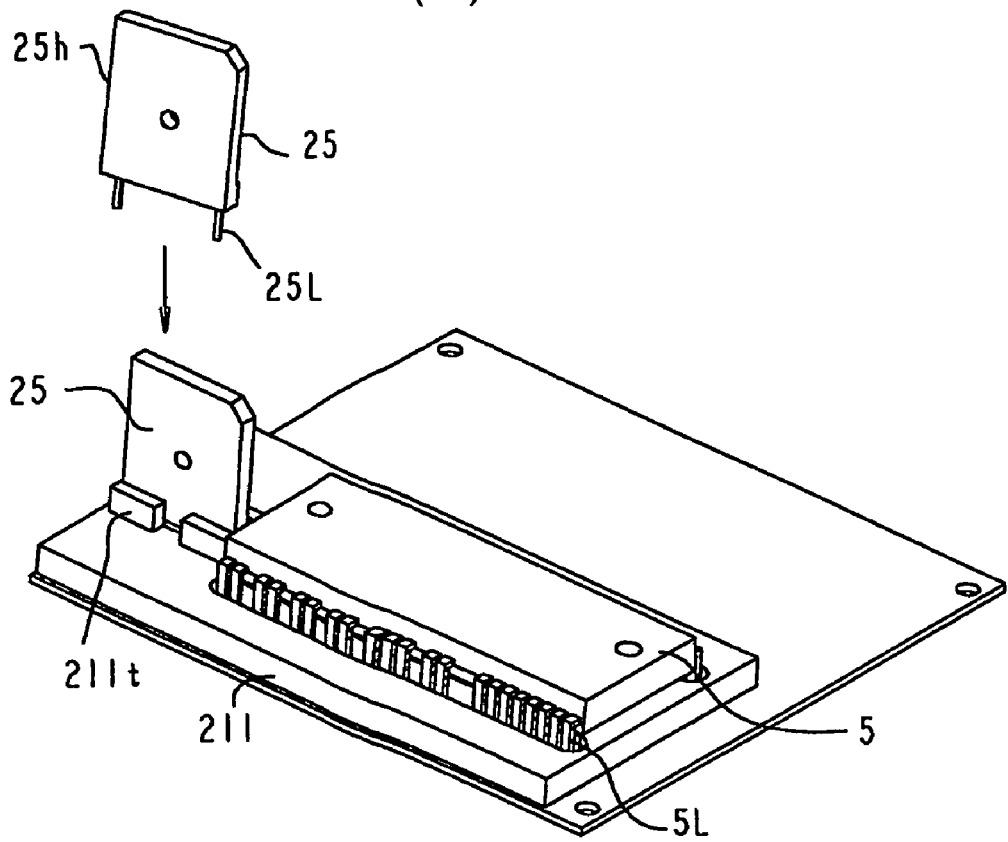
FIG. 9 is a perspective view (a) illustrating a unit composed of a diode stack, a module, a heat shield, and a printed circuit board, and a perspective view (b) illustrating the heat shield.
Figure 9:
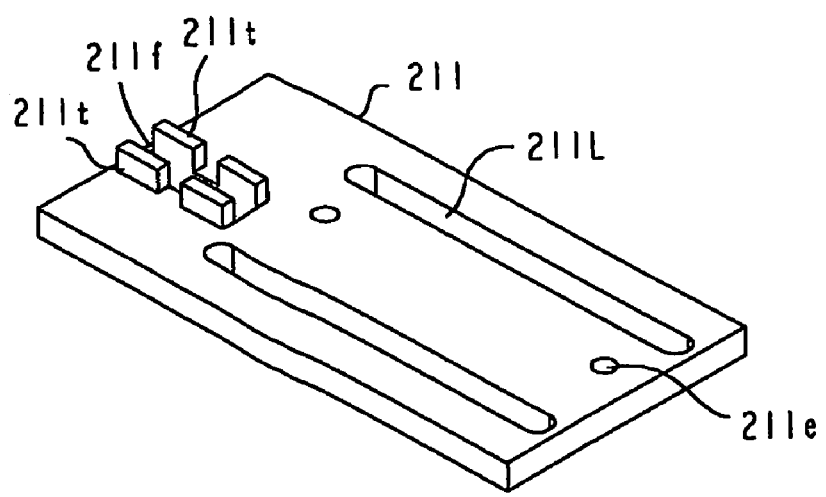

Another embodiment according to the present invention is explained using FIG. 8 and FIG. 9. FIG. 8 is a perspective view illustrating a controller according to the other embodiment; meanwhile, FIG. 9 is a perspective view (a) illustrating a unit composed of a diode stack, a module, a heat shield, and a printed circuit board, and a perspective view (b) illustrating the heat shield. The same symbols in FIG. 8 and FIG. 9 as those in FIG. 4-FIG. 5 are assigned to the same or equivalent elements, and the explanation is omitted.

In FIG. 8 and FIG. 9, the controller is provided with the printed circuit board 3, the heat-generating diode stack 25 having a rectangularly-and-vertically-arranged second main unit 25h whose lead lines 25L as the lead are fixed to the printed circuit board 3, the heat-radiation fin 7 having a mouth 7h for protruding the second main unit 25h of the diode stack 25 and also having the folds 7b, and a clip 301, having elasticity towards the open/close movement, for contacting the folds 7b to the second main unit 25h of the diode stack 25.

In a heat shield 211, a mouth 211f for allowing the second main unit 25h of the diode stack 25 to pass therethrough is provided, and protrusions 211t are also provided for supporting the second main unit 25h towards the longitudinal orientation of the mouth 211f.

According to such controller, because the folds 7b of the heat-radiation fin 7 and the second main unit 25h of the diode stack 25 contact each other by the clip 301 having elasticity towards the open/close movement, the heat-radiation fin 7 can be commonly used for the diode stack 25 and the power module 5, and using the clip 301 heat generated in the second main unit 25h of the diode stack 25 can also be radiated from the heat-radiation fin 7.

Moreover, when the diode stack 25 is fixed to the printed circuit board 3, after the power module 5 is fixed to the printed circuit board 3 through the heat shield 9, the lead lines 25L of the diode stack 25 are passed through the mouth 211f of the heat shield 211, and the lead lines 25L are fixed to the printed circuit board 3 with the second main unit 25h being picked by the protrusions 211t. Therefore, because the main unit 25h of the diode stack 25 can be supported by the protrusions 211t of the heat shield 211, when the diode stack is fixed to the printed circuit board 3, the main unit 25h of the diode stack 25 is configured to be rigid.

INDUSTRIAL APPLICABILITY

As described above, the modular heat-radiation structure and the controller including the structure according to the present invention are applicable to control motors.

What is claimed is:

1. A controller including a modular heat-radiation structure, said structure comprising:
   a printed circuit board;
   a module which generates heat, including a first main unit having a fixing hole and a lead for connecting to the printed circuit board;
   a heat-radiation fin, fixed to the top face of the first main unit, for radiating heat generated in the module;
   a resin-made insulating heat shield inserted between the printed circuit board and the first main unit; and
   a fixing element which fixes the heat shield, the module, and the heat-radiation fin; wherein:
   a lead hole for allowing the lead to pass therethrough and a first fixing hole for allowing the fixing element to pass therethrough are provided in the heat shield, and
   a second fixing hole for allowing the fixing element to pass therethrough is provided in the printed circuit board;
   wherein said controller comprises:
   an electric power source as a source for driving the module; and a case, having a mouth for opening the top face of the module, for mounting the printed circuit board, the module, the electric power source, and the heat shield; wherein:

the case includes a separator for separating from the electric power source the heat-radiation fin and the module.

2. A controller as recited in claim 1, wherein the separator includes:

a first separator attached to the case so as to be arranged along a side face of the heat-radiation fin, and a second separator, being approximately U-shaped, attached to the heat shield so as to be arranged contacting or close to the first separator.

3. A controller as recited in claim 2, wherein:

the case is made of resin, the mouth of the case is formed slightly larger than the first main unit, and a head is provided close to and facing the bottom face of the heat-radiation fin around the mouth of the case.

4. A controller including a modular heat-radiation structure, said structure comprising:

a printed circuit board;

a module which generates heat, including a first main unit having a fixing hole and a lead for connecting to the printed circuit board;

a heat-radiation fin, fixed to the top face of the first main unit, for radiating heat generated in the module;

a resin-made insulating heat shield inserted between the printed circuit board and the first main unit; and a fixing element which fixes the heat shield, the module, and the heat-radiation fin; wherein:

a lead hole for allowing the lead to pass therethrough and a first fixing hole for allowing the fixing element to pass therethrough are provided in the heat shield, and a second fixing hole for allowing the fixing element to pass therethrough is provided in the printed circuit board;

wherein said controller comprises:

a stack which generates heat, including a second main unit, whose lead is fixed to the printed circuit board, being rectangularly and vertically arranged;

a heat-radiation fin including a mouth for protruding the second main unit of the stack, and also including a fold; and a clip which contacts the fold to the second main unit, having elasticity towards its open/close movement.

5. A controller including the modular heat-radiation structure as recited in claim 4, wherein the heat shield is provided with a mouth for allowing the second main unit of the stack to pass therethrough, and also with a protrusion for supporting the second main unit along the longitudinal orientation of the mouth.

* * * * *